(12) United States Patent
Choisel et al.

(10) Patent No.: US 10,194,249 B2
(45) Date of Patent: Jan. 29, 2019

(54) MULTI-COIL LOUDSPEAKER DRIVER

(71) Applicant: Apple Inc., Cupertino, CA (US)

(72) Inventors: Sylvain J. Choisel, Palo Alto, CA (US); Simon K. Porter, San Jose, CA (US); David A. Sumberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/622,617

(22) Filed: Jun. 14, 2017

(65) Prior Publication Data

US 2018/0367917 A1    Dec. 20, 2018

(51) Int. Cl.
| | |
|---|---|
| *H04R 29/00* | (2006.01) |
| *H04R 9/06* | (2006.01) |
| *H04R 9/04* | (2006.01) |
| *H04R 3/00* | (2006.01) |
| *H03G 3/30* | (2006.01) |
| *H04R 9/02* | (2006.01) |

(52) U.S. Cl.
CPC .............. *H04R 9/06* (2013.01); *H03G 3/3005* (2013.01); *H04R 3/00* (2013.01); *H04R 9/025* (2013.01); *H04R 9/046* (2013.01); *H04R 29/001* (2013.01); *H04R 2201/028* (2013.01)

(58) Field of Classification Search
CPC   H04R 2201/028; H04R 29/001; H04R 9/046; H04R 9/025; H04R 9/06; H03G 3/3005
USPC ........ 381/59, 400, 401; 455/575.1, 315, 350
See application file for complete search history.

(56) References Cited

U.S. PATENT DOCUMENTS

| | | | | |
|---|---|---|---|---|
| 4,566,120 | A | * | 1/1986 | Nieuwendijk ........... H04R 3/08 381/117 |
| 8,008,813 | B2 | | 8/2011 | Keating |
| 8,073,187 | B2 | | 12/2011 | Hashimoto et al. |
| 8,284,982 | B2 | | 10/2012 | Bailey |
| 2006/0039578 | A1 | * | 2/2006 | Stiles ...................... H04R 9/04 381/400 |

(Continued)

FOREIGN PATENT DOCUMENTS

DE    102010010102    9/2011

OTHER PUBLICATIONS

"How can an overhung voice coil produce good sound?", *Multi-Way Conventional loudspeakers with crossovers*, Retrieved from the Internet, (Dec. 28, 2007), 6 pages.

(Continued)

*Primary Examiner* — Ammar Hamid
(74) *Attorney, Agent, or Firm* — Womble Bond Dickinson (US) LLP (57) ABSTRACT

A coil assembly is coupled to a diaphragm. The coil assembly has a number of coils that are fixed in a stacked, end to end manner along a length axis. The coils include a middle coil, a several upper coils and several lower coils. Each coil has a respective pair of coil terminals so that it can be independently driven by an audio signal. The coil assembly as a whole is overhung, while each of constituent coils is underhung so that there are at least two adjacent coils that are completely within the magnetic gap, and at least two other coils that are completely outside the magnetic gap, during a majority of the full excursion of the coil assembly. Other embodiments are also described and claimed.

21 Claims, 6 Drawing Sheets

(56) References Cited

U.S. PATENT DOCUMENTS

| | | | | |
|---|---|---|---|---|
| 2012/0257771 A1* | 10/2012 | Bai | ................. | H04R 3/00 |
| | | | | 381/120 |
| 2016/0142841 A1* | 5/2016 | Petroff | ................. | H04R 9/046 |
| | | | | 381/394 |
| 2017/0148547 A1* | 5/2017 | Dolan | ................. | C25D 9/12 |

OTHER PUBLICATIONS

"Optimal Voice Coil Rest Position", *Application Note to the Klippel R&D System—Revision 1.2*, (Aug. 1, 2016), 5 pages.
Saito, Ryota, et al., "A Digitally Direct Driven Dynamic-type Loudspeaker", *Audio Engineering Society Convention Paper 7344 Presented at the 124th Convention*, (May 17-20, 2008), 8 pages.
Chinese Office Action (First Rectification) dated Oct. 31, 2018, for related Chinese Patent Appln. No. 201820880002.8 4 Pages.

\* cited by examiner

MULTI-COIL LOUDSPEAKER DRIVER

FIELD

An embodiment of the invention relates to electro-dynamic loudspeaker drivers and in particular those that have an overhung voice coil. Other embodiments are also described.

BACKGROUND

In an electro-dynamic loudspeaker, the voice coil is described as overhung when the height of the voice coil along a central length axis (vertical axis) of the coil is greater than the height of the magnetic gap in which the coil is positioned to move (in the direction of the length axis). This allows some portion of the coil to always be within the magnetic gap even at maximum excursion (displacement), which produces greater output sound power. The force produced by such a driver however, upon the diaphragm is limited, due to the fact that a majority of the turns (windings) of the coil find themselves outside of the magnetic gap thereby contributing less to the total Lorentz force.

It has been suggested to design a voice coil assembly to have multiple coils, where each coil is electrically independent and is successively positioned along the length axis of the voice coil, where each coil has an axial length that is substantially equal to the height of the magnetic gap. A means for measuring the axial position (along the length axis) of the coil, relative to the magnetic gap, is provided. Such measurements are then used by a control module, which controls audio amplifiers that are coupled to drive the coils, respectively, so that any coil that is least partly present within the magnetic gap is driven with the audio signal, while the coils that are outside of the magnetic gap are not. This may increase power consumption efficiency while producing a Lorentz force that is commensurate with that of the overhung, single coil structure.

SUMMARY

In accordance with an embodiment of the invention, a multi-coil loudspeaker driver has a coil assembly that is coupled to a diaphragm, where the coil assembly has at least four coils that are fixed in a stacked, end-to-end manner along a length axis of the coil assembly. A height of the coil assembly is at least a sum of the heights of the coils, and the coil assembly as a whole is overhung (relative to the height of the magnetic gap). Each of the coils is underhung such that there are at least two adjacent coils that are completely within the magnetic gap, while at least two other coils are at least partially, or in some cases completely, outside the magnetic gap, during at least a majority of the full excursion of the coil assembly. This arrangement for the voice coil, in which there are at least four coils each of which is underhung and at least two adjacent coils are within the magnetic gap at any given moment, may enable finer granularity control of the total power consumption (by the coil assembly as a whole) which means more efficient production of the Lorentz force, thus lowering overall power consumption.

In one embodiment, only one coil at a time is "faded out" (its amplifier gain is reduced from a high level to a low level), as the coil is exiting the gap. In another embodiment, referred to as an overlapping drive embodiment, two adjacent coils are faded out simultaneously, even though only one of the them is actually exiting the gap and the other still remains entirely within the gap, because doing so provides greater tolerance for imprecise sensing of the position of the coil assembly 2. In the opposite scenario where those two adjacent coils are entering the gap, the coils are "faded in" (their amplifier gains are increased from the low level to the high level) simultaneously, even though one of the is actually entering the gap and the other still remains entirely outside the gap.

In one embodiment, the coils include a middle coil, at least one upper coil (adjacent to the middle coil), and at least one lower coil (adjacent to the middle coil), and each of these three coils has variable turn density, e.g., the middle of the coil has a higher turn density than at its top end and its bottom end. This feature may enable a smoother transition in the forces produced by the coil assembly, as one coil enters the magnetic gap. This may also enable simpler control of the multiple audio amplifiers that are coupled to drive the coils with an audio signal, by for example maintaining the audio amplifier gain constant for a given coil even as the coil is entering the magnetic gap. In one embodiment, each of the coils has a trapezoidal cross section and is arranged end to end such that there is a region of turns, resulting from the tapered ends of the trapezoidal envelopes of each pair of adjacent coils, that has a reduced density of turns (relative to a middle region of turns in each coil.) In another embodiment, each of the coils has a rectangular cross section and is arranged end to end such that there is an inter-coil gap between each pair of adjacent coils (a "turn free" region that adjoins each pair of coils.)

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
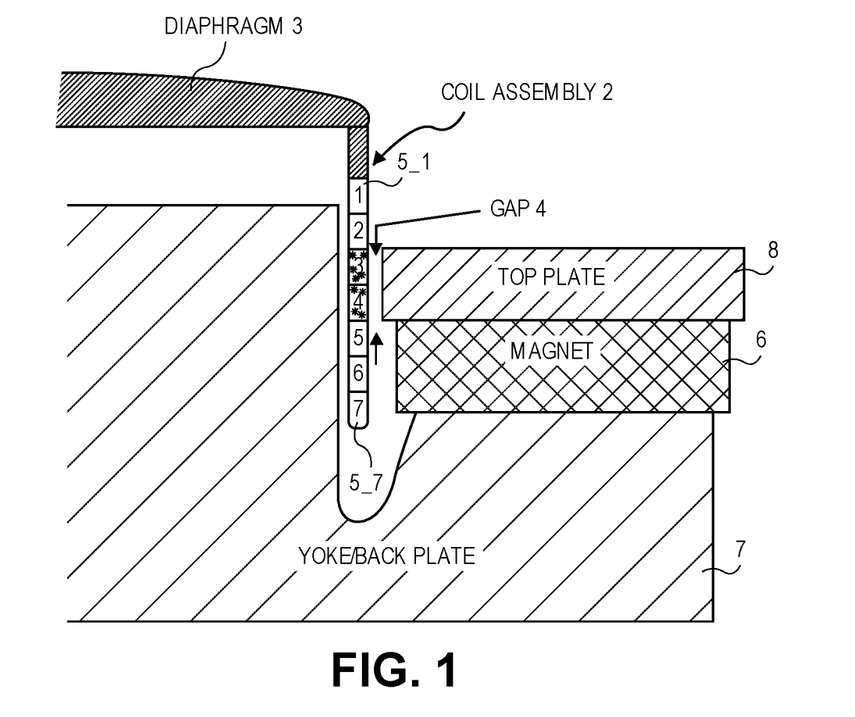
FIG. 1 is a section view of part of a loudspeaker driver having a multi-coil coil assembly.

FIG. 1 is a section view of part of a loudspeaker driver having a multi-coil coil assembly 2. The coil assembly 2 has a toroid shape where the windings or turns of wire form the perimeter of a toroid, leaving a hole in the middle. FIG. 1 only shows a section view of one half of the toroid, with the understanding that the other half of the toroid may be depicted by a mirror image. The term "toroid" is used here more generically than a fully rounded surface of revolution, and instead may also refer to a generally ring shaped object that need not be circular, and instead could be ellipsoidal, rectangular or square. The coil assembly 2 may be formed into its toroid shape with or without the use of a former, where the latter may be a separate piece acting as a structural support member or frame around which wire is wound to form the constituent coils of the coil assembly 2.

Figure 2:
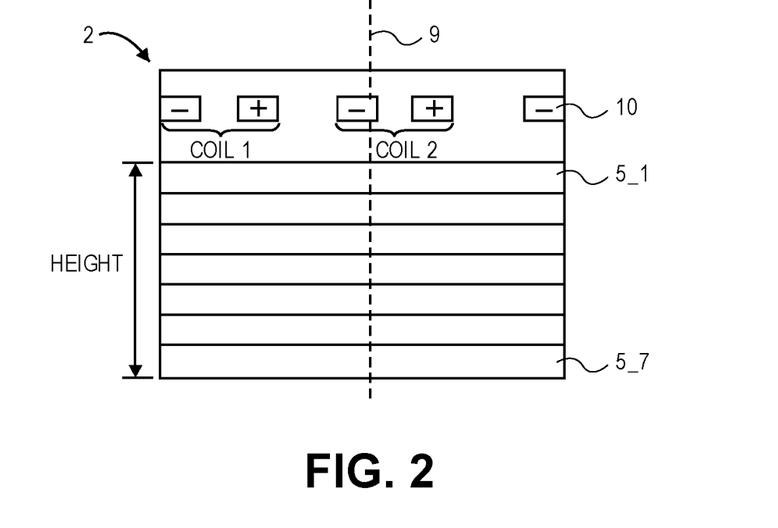
FIG. 2 illustrates a section view of an example coil assembly.

The coil assembly 2 has a number of coils $5\_1, 5\_2, \ldots$, at least four although in FIG. 1 the coil assembly 2 is shown as having seven coils. The coils 5 are fixed in a stacked, end-to-end manner as shown, along a length axis 9 (see FIG. 2) of the coil assembly 2. FIG. 2 shows a side view of the coil assembly 2 of FIG. 1, where the seven coils $5\_1, 5\_2, \ldots 5\_7$ can be seen in the stacked arrangement. The height of the coil assembly 2 as given in FIG. 2 is at least a sum of the heights of the individual coils 5, respectively. Also, each coil 5 has a respective pair of coil terminals 10 (see FIG. 2) so that it can be independently driven by an audio signal (applied to the two terminals, + and −, of each coil.) In the embodiment of FIG. 2, the terminals 10 are arranged around the perimeter of the toroid shape towards the top end of the coil assembly 2, e.g., on a top end of the former around which the wire has been wound, but other arrangements for locating the coil terminals 10 are possible. As seen in the example of FIG. 1, there is a middle coil $5\_4$, three upper coils $5\_1, 5\_2, 5\_3$, and three lower coils $5\_5, 5\_6, 5\_7$. Alternatives to this include a coil assembly 2 that has four coils, five coils, six coils, or greater than seven coils.

Figure 3:
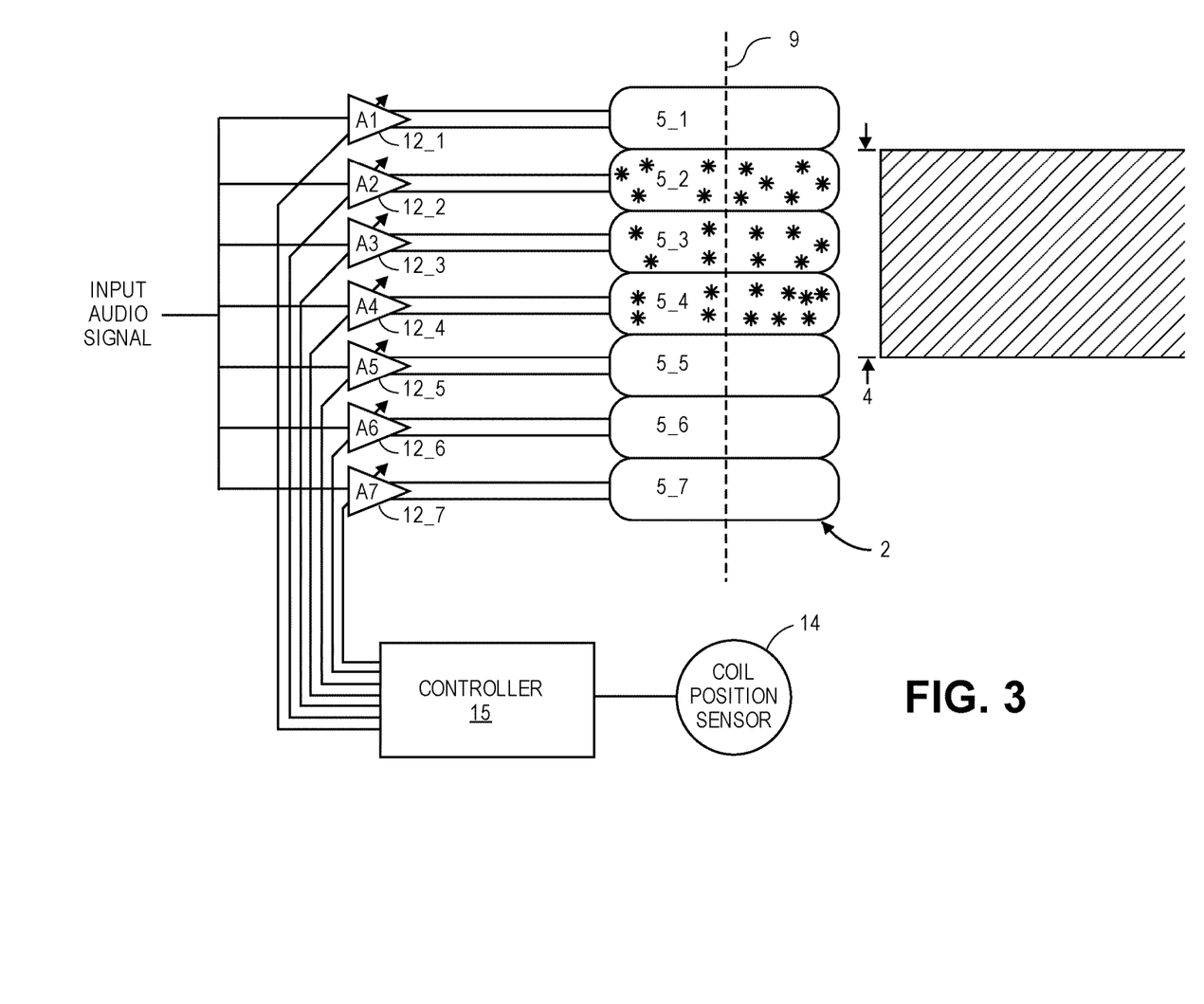
FIG. 3 illustrates part of an audio system that has the multi-coil loudspeaker driver, where each coil is driven by its respective audio amplifier.

Still referring to FIG. 2, this figure illustrates the example where each coil has a respective pair of coil terminals 10 that may be connected by a separate pair of wires (not shown) to a pair of output nodes of an audio amplifier—see e.g., FIG. 3. As an alternative however, one of the respective pair of coil terminals 10 can be coupled to a common terminal, such that each coil can still be independently driven by an audio signal through another one of its respective pair of coil terminals 10. Thus, for example, the "−" terminal of each of the seven coils may be electrically connected to a single, common node or terminal, and this single common terminal is also shared by all of the audio amplifiers that drive the seven coils.

The coil assembly 2 is positioned for movement in the direction of the length axis 9, within an annular or toroid shaped magnetic gap 4. The gap 4 is defined by a magnetic system of the driver. In this example, the magnetic system is composed of at least the following magnetic elements: a yoke/back plate 7; a magnet 6 that lies against the yoke/back plate 7, and a top plate 8 that lies against the magnet 6 as shown, and where the magnetic gap 4 is defined by the thickness of the top plate 8. Note that alternatives to such a magnetic system are possible that can also produce the desired magnetic flux density within the gap 4, including those that have a magnet piece which lies within the middle hole of the toroid shaped coil assembly 2 (and that itself may also be covered by a separate top plate piece.) There is a trough formed below the magnetic gap 4 that allows for the desired excursion of the coil assembly 2 in the downward direction, where in this case the maximum excursion may be limited by a stop structure (not shown).

Observe that while the coil assembly 2 as a whole is overhung in that its height (see FIG. 2) is greater than the height of the magnetic gap 4, each of the individual coils $5\_1, 5\_2 \ldots 5\_7$ is underhung such that there are at least two adjacent coils, in this example the coils $5\_3$ and $5\_4$ as seen in the excursion state shown in FIG. 1, which are completely within the magnetic gap 4, and at least two other coils that are completely outside the magnetic gap, during a majority of the movement (or full excursion) of the coil assembly 2. In the snapshot of the movement of the coil assembly 2 shown in FIG. 1, only two coils, namely coils $5\_3$ and $5\_4$ are completely within the magnetic gap 4. As the coil assembly moves up and down within its full excursion range (in response to being driven by the audio signal at the coil terminals 10), the adjacent pair of the in this case seven coils 5, that find themselves within the magnetic gap 4 and that are being driven by the audio signal in that state, will change dynamically or in accordance with the audio signal. In other words, only the two or more adjacent coils that are within the gap 4 are being driven by the audio signal (while the other coils that are completely outside the magnetic gap 4 are un-driven, for example receiving zero voltage at their terminals 10.

The coil assembly 2 is to be driven by an audio amplifier subsystem that is configured to drive the coils that happen to be within the magnetic gap 4, while not driving those that are outside of the magnetic gap 4, based on sensing displacement of the coil assembly 2 (or otherwise based on another source of real-time coil position data), such that the strength at which the coil is driven is based on the coil position data. More on this aspect is given below in connection with FIG. 4 and FIGS. 6A-6C. In the meantime, turning now to FIG. 3, this combined block diagram and circuit schematic illustrates part of an audio system that has a multi-coil loudspeaker driver that uses the coil assembly 2, and in particular where each individual coil 5_1, 5_2, . . . 5_7 is driven by a respective audio amplifier 12_1, 12_2 . . . 12_7. Note how in this embodiment, each of the audio amplifiers 12 receives the same input audio signal, or in other words the input audio signal is duplicated and fed in synch or in parallel, to the input of each of the audio amplifiers 12, respectively. A controller 15 is configured to control audio amplifier gain in the audio amplifier subsystem, based on coil position data that is produced by a coil position censor 14. The coil position data is indicative of displacement of the coil assembly 2 (during its full excursion within the magnetic gap 4.) A calibration procedure may be performed prior to operation of the loudspeaker driver, so that the coil position data is accurately "mapped" to the actual position of the individual coils 5 (using knowledge of the height of each individual coil and the height of the magnetic gap.) The controller 15, configured with such calibration information, can cause at least two (or other greater number, depending on the design of the coil assembly 2) adjacent coils, for example as shown in FIG. 3 coils 5_2, 5_3 and 5_4, which are completely within the magnetic gap 4, to be driven with the input audio signal, while at least two other coils that are completely outside the magnetic gap 4 are un-driven (here, the coils 5_1, 5_6 and 5_7). Note that the coil 5_5 is in transition: if in the snapshot of FIG. 3 the coil assembly 2 is moving upward along the axis 9, then it may be un-driven at that instant, but will start to be driven as soon as it is deemed by the controller 15 (evaluating the present coil position data) to be within the magnetic gap 4; if however the snapshot of FIG. 3 is when the coil assembly 2 is moving downward, then the coil 5_5 may be deemed (by the controller 15) to have just left the gap 4 and is accordingly un-driven.

Figure 4:
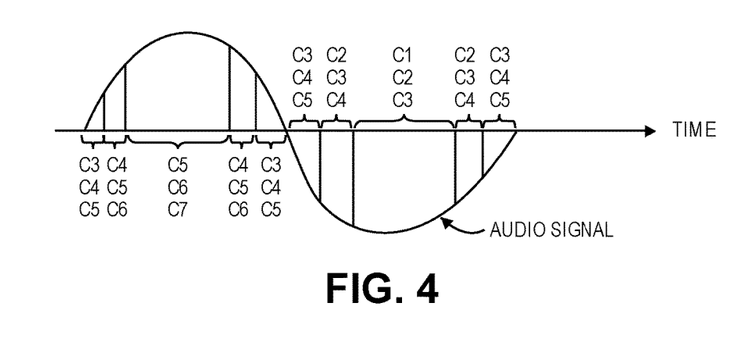
FIG. 4 shows how a trio of coils are always being driven albeit different combinations at different stages of an audio signal.

Returning to FIG. 3, the controller 15 has the needed logic circuitry that can, based on the coil position data that is being updated instantaneously or in real time by the coil position censor 14, decide which two or more adjacent ones of the coils are to be driven, at any given moment. FIG. 4 shows an example where the coil assembly 2 and the gap 4 are sized such that there is always a trio of adjacent coils that are within the gap 4. The example audio signal that is driving the coil assembly 4 in FIG. 4 is a pure sinusoid. The full excursion of the coil assembly 2, or the period or cycle of the sinusoid, is divided in this example into ten (10) sectors. When the signal is in sector 1, only coils 3, 4, 5 are in the gap (and are therefore the only ones that driven.) Next, the signal rises in sector 2, causing coils 4, 5, 6 to come into gap—only those are now driven. In other words, during the transition from sector 1 to sector 2, coil 3 is transitioned from being driven to being un-driven, while coils 4, 5 continue to be driven. Next, the signal rises and crests and begins to fall in sector 3—here, coil 4 transitions to being un-driven while coil 7 transitions to being driven, and so only coils 5, 6, 7 are in the gap (and are being driven.) The process continues with sector 4, which has similar signal amplitude as sector 2, and hence the same group of adjacent coils, 4, 5, 6 find themselves in the gap (albeit moving in the opposite direction than in sector 2.) Then come sectors 5 and 6, each of which is similar to sector 1 except with opposite polarity—the group of coils 3, 4, 5 remain in the gap and continue to be driven in both sectors 5 and 6. The process continues with sector 7 in which coils 2, 3, 4 now find themselves in the gap (and are now the only ones driven), and so on with sectors 8-10.

Figure 5:
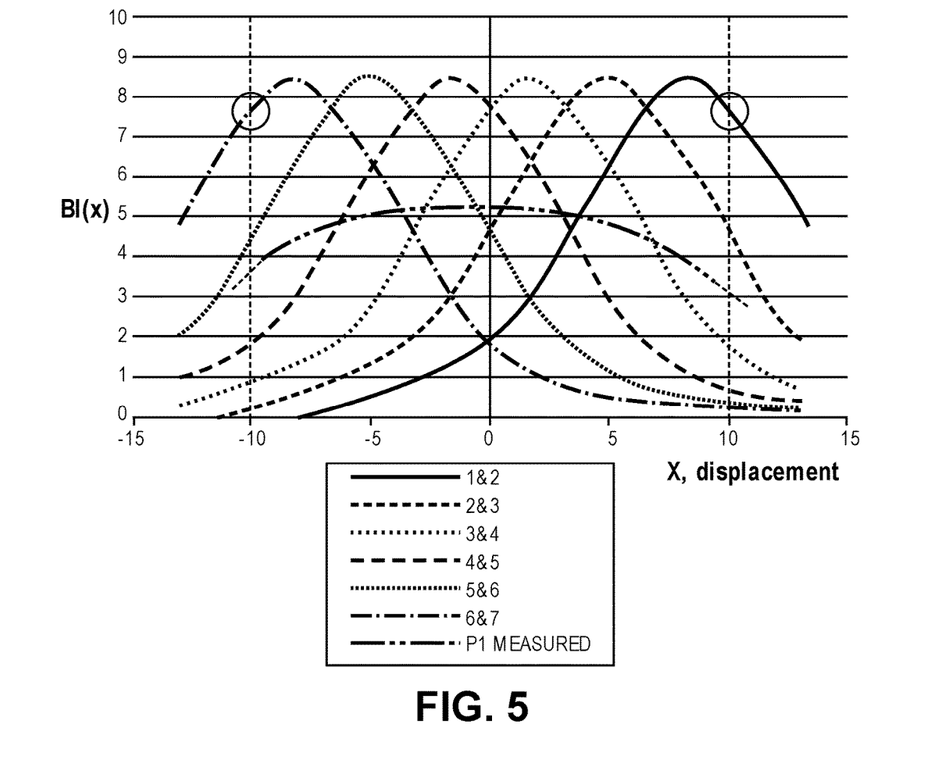
FIG. 5 depicts force factor versus displacement for six, respective adjacent pairs of coils, of a multi-coil loudspeaker driver having seven coils, where only one pair of adjacent coils are being driven at any given moment.

FIG. 5 illustrates how a multi-coil loudspeaker driver (having for example the coil assembly 2 with seven coils 5) can generate significantly more force factor Bl than a single overhung coil loudspeaker driver. This graph shows force factor Bl vs. coil displacement, where the curve for the single overhung coil loudspeaker drive is plotted as P1 Measured. Note how flat that curve is across the full excursion, −10 to +10, albeit at a significantly lower level than the peaks of the Bl curves produced by each pair of adjacent coils of the multi-coil driver (for the same power consumption.) The peaks occur only when that pair of adjacent coils is within the magnetic gap. An approach to smooth out the transition between adjacent peaks is needed.

Figure 6A:
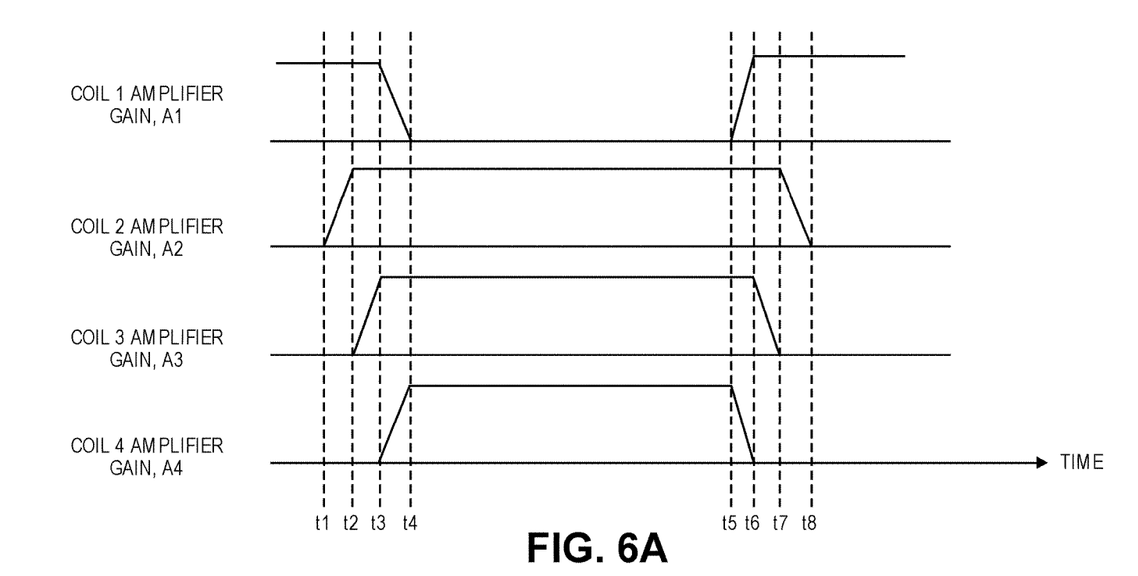
FIG. 6A depicts an example of a technique for controlling the gains of the coil amplifiers, over a cycle in which a number of adjacent coils enter the magnetic gap and then exit the magnetic gap.
Figure 6B:
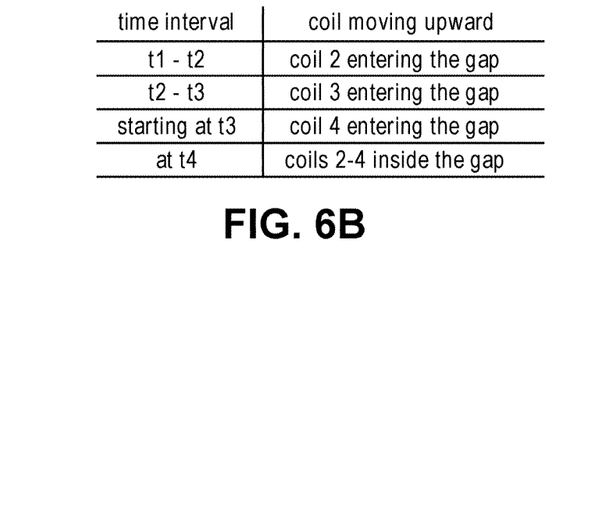
FIG. 6B is a table that describes certain time intervals indicated in FIG. 6A, by referring to the corresponding state of the coil assembly in relation to the magnetic gap as certain coils are moving upward and entering the gap.
Figure 6C:
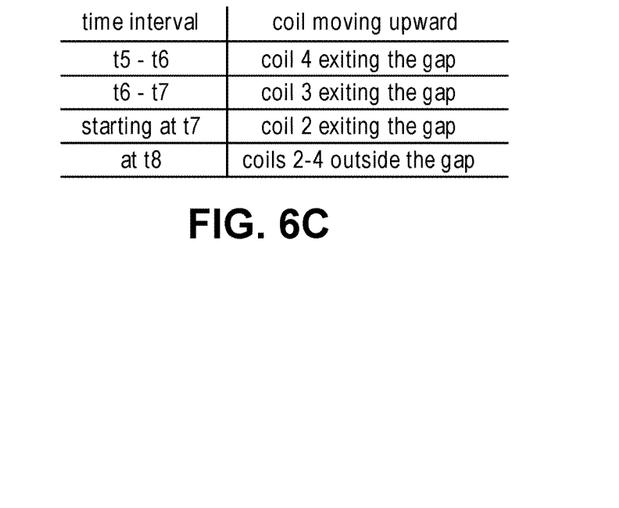
FIG. 6C is a table that describes certain other time intervals indicated in FIG. 6A, by referring to the corresponding state of the coil assembly in relation to the magnetic gap as the coils moving downward and exiting the gap.

Turning now to FIGS. 6A-6C, these figures show an example of how to gradually vary the gains of the audio amplifiers 12 (FIG. 3) that are driving the coils 5 which are within the magnetic gap 4, in order to smooth out the transitions between adjacent force factor MD peaks, as the coils 5 enter and exit the gap 4. When an individual coil 5 is entering the gap 4, the controller 15 (based on its predetermined knowledge of the height of an individual coil and how the coil position data maps to the position of that coil within the gap 4) increases the gain of the amplifier that is driving that coil, from a low level to a high level in proportion to how much of the (height) of the coil is within the gap 4. In one embodiment, the low level is zero gain (which means zero output by the amplifier), and the high level is the maximum gain, and such a two state (binary) gain is the same for all of the amplifiers 12, making the solution advantageously simple to implement. Finer granularity control of the gain of the amplifiers 12 is possible at the expense of greater complexity.

FIGS. 6A-6B, time intervals t1-t4, may be used to illustrate the case where the coil assembly 2 is moving upward, and coil 5_2 is about to enter the gap 4. Since coil 5_2 is entering the gap during time interval t1-t2, its amplifier gain A2 is being increased gradually, or in proportion to how much of the coil 5_2 is within the gap 4. Next, in time interval t2-t3, coil 5_3 is entering the gap 4 and so its amplifier gain A3 is increased gradually, in proportion to how much of the coil 5_3 is within the gap 4. Note how in the same interval t2-t3, coil 5_2 is now entirely within the gap 4 and so its amplifier gain is maintained at the high level. The process continues, starting at t3, which is when coil 5_4 is entering the gap 4, until t4 when the three coils 5_2, 5_3, 5_4 are all within the gap 4, and all of their respective amplifier gains are at the high level. Note that in the time interval t3-t4, the coil position data is interpreted by the controller 15 to mean that coil 5_1 is exiting the gap 4: the controller 15 accordingly decreases the amplifier gain A1 during that interval, from the high level back down to the low level in proportion to how much of the coil 5_1 is outside of the gap 4. This signal processing approach, where the controller 15 makes the amplifier gain transitions gradual (rather than abrupt) may help flatten the curve of the force factor Bl produced by the coil assembly 2.

Referring to time intervals t5-t8 and FIG. 6A and FIG. 6C, these support a description that is analogous to the one given above for the coil moving upward in intervals t1-t4. In intervals t5-t8, the coil assembly 2 is moving downward, starting with coil 5_4 exiting the gap 4 at t5 such that its amplifier gain A4 is decreasing from the high level to the low level, in proportion to how much (height) of the coil 5_4 is outside of the gap 4. A similar behavior is observed for the coil 5_3 and the coil 5_2 as each exits the gap 4, respectively. Note how the gain A1 for the coil 5_1 rises from the low level to the high level during interval t5-t6, because coil 5_1 is now entering the gap 4 again.

FIGS. 6A-6C illustrate an embodiment where only one coil at a time is "faded out" (its respective amplifier gain is reduced from a high level to a low level), as the coil is exiting the gap. In another embodiment however, two adjacent coils are faded out simultaneously, even though only one of them is actually exiting the gap while the other still remains entirely within the gap, because doing so yields greater tolerance for imprecise sensing of the position of the coil assembly 2. This "overlapping drive" technique can also be applied when the two adjacent coils are entering the gap, where in that case the gain of a first audio amplifier (that is driving a first coil with the audio signal) is increased as the first coil is entering the magnetic gap, simultaneously with increasing the gain of a second audio amplifier, that is driving a second coil with the audio signal, while the second coil has not yet entered the magnetic gap.

Figure 7:
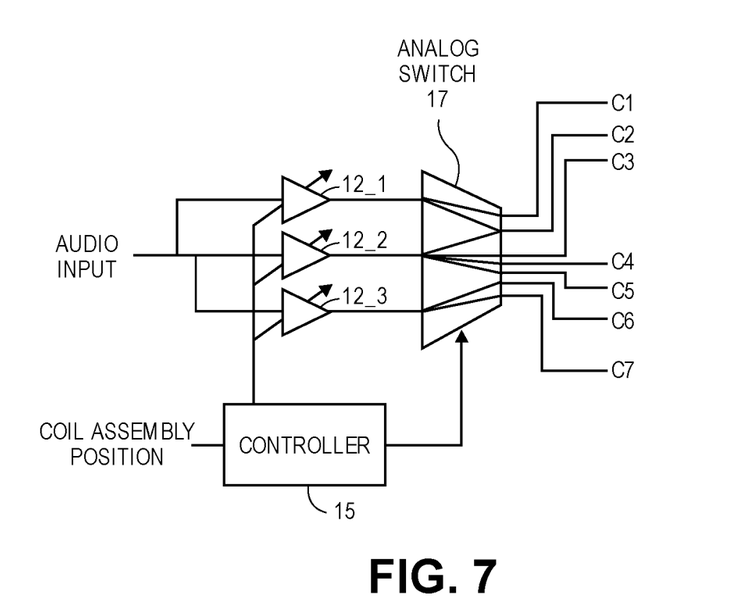
FIG. 7 depicts another embodiment where the coils are driven by a fewer number of audio amplifiers.

Turning now to FIG. 7, this depicts another embodiment where the coils 5 are driven by a fewer number of audio amplifiers 12, in contrast to the embodiment shown in FIG. 3 wherein the coils 5 are driven by an equal number of audio amplifiers 12. A multi-coil loudspeaker driver could be driven by the audio amplifier subsystem shown in FIG. 7, where three audio amplifiers 12_1, 12_2, 12_3 are driving, and are being shared by, seven coils 5_1, 5_2, ... 5_7 (through individual coil drive signals C1, C2, ... C7.) More generally, in this embodiment, there can be M>=2 audio amplifiers 12 that are fewer in number than the N<=4 coils 5. To facilitate such sharing of the amplifiers 12, an analog switch 17 has N outputs that are coupled to the N coils 5, respectively, as shown. The analog switch may be configured to operate as an M-pole multi-throw switch that has M inputs coupled to M outputs of the amplifiers 12, respectively, and N outputs coupled to N terminals of the coils 5, respectively (producing individual coil drive signals C1, C2, ...) In the case of seven coils, a 3-pole 5-position switch may be used, because there are five different "throws" or positions that correspond to five different combinations of the trio of coils, as seen in FIG. 4.

Figure 8:
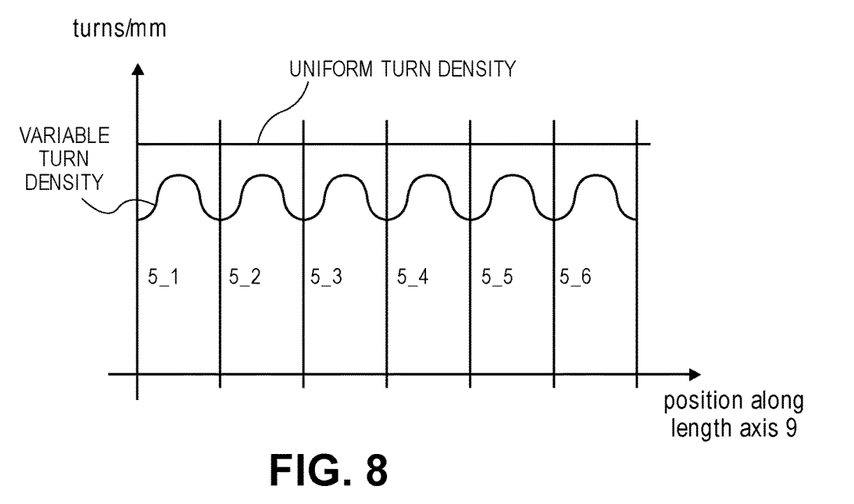
FIG. 8 graphically shows how the variable turn density in each coil compares relative to a uniform turn density configuration.

Another way to achieve smooth transitions between the force factor (Bl) peaks of FIG. 5 is to construct the coils 5 to have variable turn density. FIG. 8 graphically and conceptually shows variable turn density in each of the coils 5_1, 5_2, ..., and uniform turn density, where in the latter configuration the density of turns or windings is the same in each of the coils. With variable turn density, the density of the turns is higher at a middle of a coil than at a top end and a bottom end of the coil (as depicted in the figure by the downward sloping curves on either side of a center crest.) In one embodiment, all of the coils have the same variable density configuration. In other cases, however, there may be a mix of variable turn density and uniform turn density coils that make up the coil assembly 2. For example, consider the case where the coil assembly 2 has five coils; each of the middle coil, at least one of the upper coils, and at least one of the lower coils can have variable turn density, while the upper most coil and the lower most coil may each uniform turn density. When variable density coils are used, a smooth transition between the force factor peaks may still be obtained even when the controller 15 is not gradually changing the amplifier gains but instead is abruptly doing so (e.g., switching on an amplifier when the respective coil is entering the gap 4, and then switching off the amplifier when the respective coil is exiting the gap 4.) However, the gradual gain changing approach described may be used in conjunction with variable density coils to help reach the goal of even smoother transitions between the force factor peaks.

Figure 9:
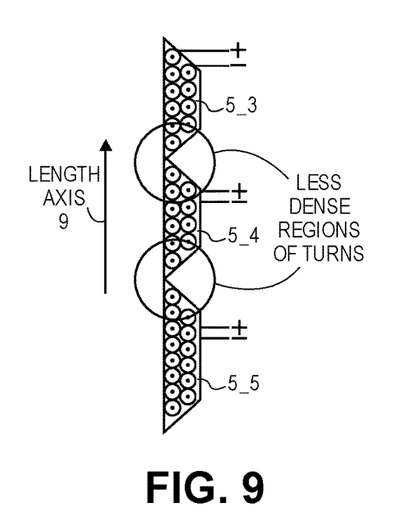
FIG. 9 shows an embodiment of a coil assembly that uses trapezoidal shaped (trapezoidal envelope) individual coils.

Turning now to FIG. 9, an embodiment of the coil assembly 2 is shown in which the individual coils 5 are trapezoidal shaped (or have trapezoidal envelopes.) This is an example of the concept of a variable turn density coil introduced above in connection with FIG. 8. As seen in the example of FIG. 9, each of the following coils of the coil assembly 2 here has a trapezoidal shape: a middle coil, in this case coil 5_4, at least one of the upper coils, in this case coil 5_3, and at least one of the lower coils, here coil 5_5. The coils are aligned along the length axis 9 of the coil assembly 2, arranged end to end as shown, so that at the junction of the ends of a pair of adjacent coils, there is a region that has reduced turn density. This so-called "less dense region of turns" is formed by virtue of the sloping end regions (of the trapezoidal shape.)

Figure 10:
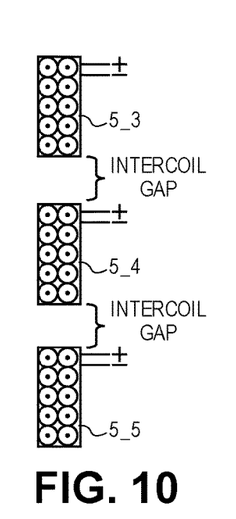
FIG. 10 illustrates a coil assembly having rectangular shaped coils that are separated by an inter coil gap.

FIG. 10 illustrates the coil assembly 2 having rectangular shaped coils that are arranged end to end along the length axis 9 but are separated by an inter coil gap. This is another coil construction technique that may help smooth the transitions between the force factor peaks of FIG. 5. The coils 5 in each adjacent pair are spaced apart from each other, end-to-end, by an inter-coil gap that is devoid of turns or windings. The inter-coil gap may cause a reduction in Lorentz force as that portion of the coil assembly 2 enters the magnetic gap 4.

Figure 11:
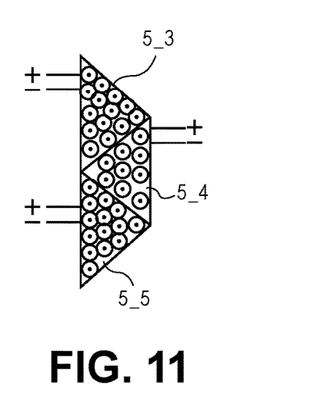
FIG. 11 shows a coil assembly whose coils have triangular sections and that are arranged to abut each other and whose adjacent coils are arranged to abut each other.

FIG. 11 shows the coil assembly 2 whose individual coils 5 have triangular cross sections and that are arranged to abut each other along an entire side of the triangular shape, thereby precluding an inter-coil gap (see FIG. 10) and precluding any less dense regions of turns (see FIG. 9.)

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, while FIG. 1 depicts a section view of part of a loudspeaker driver or motor in which there is a magnet sandwiched by the yoke/back plate and the top plate, more complex motors are possible including those having more complex magnetic systems. The description is thus to be regarded as illustrative instead of limiting.

What is claimed is:
1. A multi-coil loudspeaker driver, comprising:
a diaphragm;
a coil assembly coupled to the diaphragm, the coil assembly having a plurality of coils that are fixed in a stacked, end to end manner along a length axis of the coil assembly, wherein a height of the coil assembly is at least a sum of the heights of the plurality of coils, respectively, wherein the plurality of coils include a middle coil, a plurality of upper coils and a plurality of lower coils, and wherein each coil has a respective pair of coil terminals so that it can be independently driven by an audio signal; and
a magnetic system that defines a magnetic gap in which the coil assembly is positioned for movement, wherein the coil assembly as a whole is overhung, and each of the plurality of coils is underhung, and wherein there are at least two adjacent coils, from the plurality of coils, that are completely within the magnetic gap, and at least two other coils that are completely outside the magnetic gap, during a majority of the movement of the coil assembly.

2. The multi-coil loudspeaker driver of claim 1 wherein for each coil, one of the respective pair of coil terminals is coupled to a common terminal, and each coil is to be independently driven by an audio signal through another one of the respective pair of coil terminals.

3. The multi-coil loudspeaker driver of claim 1 wherein each of the middle coil, at least one of the upper coils, and at least one of the lower coils has variable turn density, with a higher turn density at a middle of the coil than at a top end and a bottom end of the coil.

4. The multi-coil loudspeaker driver of claim 3 wherein each of the middle coil, said at least one of the upper coils and said at least one of the lower coils has a trapezoidal cross section.

5. The multi-coil loudspeaker driver of claim 3 wherein each of the middle coil, said at least one of the upper coils and said at least one of the lower coils has a triangular cross section.

6. The multi-coil loudspeaker driver of claim 1 wherein each adjacent pair of the plurality of coils are spaced apart from each other end-to-end by an inter-coil gap that causes a reduction in Lorentz force during displacement of the coil assembly within the magnetic gap.

7. The multi-coil loudspeaker driver of claim 1 in combination with
  a position sensor that is to produce coil position data indicative of displacement of the coil assembly within the magnetic gap; an audio amplifier subsystem that is coupled to drive the plurality of coils with the audio signal; and
  a controller configured to control audio amplifier gain or audio amplifier output routing in the audio amplifier subsystem, based on the coil position data, to cause said at least two adjacent coils, from the plurality of coils, that are completely within the magnetic gap, to be driven with the audio signal, while said at least two other coils that are completely outside the magnetic gap to be un-driven.

8. The multi-coil loudspeaker driver of claim 7 wherein the audio amplifier subsystem comprises a plurality of audio amplifiers coupled to drive the plurality of coils, respectively.

9. The multi-coil loudspeaker driver of claim 7 wherein the audio amplifier subsystem comprises:
  a plurality, M, of audio amplifiers that are fewer in number than the plurality, N, of coils; and
  an analog switch that is coupled to the plurality of coils, respectively, wherein the analog switch is configured as an M-pole multi-throw switch that has M inputs coupled to M outputs of the plurality of audio amplifiers, respectively, and N outputs coupled to N terminals of the plurality of coils, respectively.

10. The multi-coil loudspeaker driver of claim 7 wherein the controller is configured to increase amplifier gain of a coil that is entering the magnetic gap, from a low level to a high level, in proportion to how much of the coil is within the magnetic gap.

11. The multi-coil loudspeaker driver of claim 10 wherein the controller is configured to decrease the amplifier gain of the coil when the coil is exiting the magnetic gap, from the high level to the low level, in proportion to how much of the coil is outside of the magnetic gap.

12. The multi-coil loudspeaker driver of claim 7 wherein i) the middle coil, ii) at least one of the upper coils, and iii) at least one of the lower coils each have variable turn density, with a higher turn density at a middle of each than at a top end and a bottom end of each, and wherein the controller is configured to control a gain of an amplifier in the subsystem that is driving a respective coil, by switching on and switching off the amplifier as the respective coil enters and exits the magnetic gap, respectively.

13. The multi-coil loudspeaker driver of claim 7 wherein each adjacent pair of the plurality of coils are spaced apart from each other end-to-end by an inter-coil gap that causes a reduction in Lorentz force during displacement of the coil assembly within the magnetic gap, and wherein the controller is configured to maintain constant audio amplifier gains for driving the coils, respectively, with the audio signal, as each of the coils enters and exits the magnetic gap.

14. A method for operating a multi-coil loudspeaker driver having a coil assembly in which a plurality of coils are each independently drivable with an audio signal, comprising:
  increasing gain of a first audio amplifier that is driving a first coil of the coil assembly with the audio signal, as the first coil is entering a magnetic gap, from a low level to a high level in relation to how much of the first coil is within the magnetic gap; and then increasing gain of a second audio amplifier that is driving a second coil of the coil assembly with the audio signal, as the second coil is entering the magnetic gap, from the low level to the high level in relation to how much of the second coil is within the magnetic gap; and
  maintaining the gains of the first and second audio amplifiers at the high level simultaneously, while i) the first and second coils are each completely within the magnetic gap and ii) third and fourth coils of the coil assembly are each at least partially outside the magnetic gap and are un-driven by the audio signal.

15. The method of claim 14 further comprising sensing displacement of the coil assembly within the magnetic gap to produce coil position data, wherein increasing and maintaining the gains of the first and second audio amplifiers is based on the coil position data.

16. The method of claim 14 wherein the low level is zero so that the amplifier has zero output.

17. A method for operating a multi-coil loudspeaker driver having a coil assembly in which a plurality of coils are each independently drivable with an audio signal, comprising:
  increasing gain of a first audio amplifier that is driving a first coil of the coil assembly with the audio signal, as the first coil is entering a magnetic gap, simultaneously with increasing gain of a second audio amplifier that is driving a second coil of the coil assembly with the audio signal while the second coil has not entered the magnetic gap; and maintaining the gains of the first and second audio amplifiers constant while i) the first and second coils are each completely within the magnetic gap and ii) third and fourth coils of the coil assembly are each at least partially outside the magnetic gap and are un-driven by the audio signal.

18. The method of claim 17 further comprising
  decreasing gain of the second audio amplifier that is driving the second coil with the audio signal, as the second coil is exiting the magnetic gap, simultaneously with decreasing gain of the first audio amplifier that is driving the first coil with the audio signal, while the first coil is still within the magnetic gap.

19. The method of claim 18 wherein increasing gain of the first audio amplifier and decreasing gain of the first audio amplifier comprises switching on the first audio amplifier and switching off the first audio amplifier, respectively.

20. An audio system, comprising:

a diaphragm;

a coil assembly coupled to the diaphragm, the coil assembly having a plurality of coils that are fixed in a stacked, end to end manner along a length axis of the coil assembly, wherein a height of the coil assembly is at least a sum of the heights of the plurality of coils, respectively, wherein the plurality of coils include a middle coil, a plurality of upper coils and a plurality of lower coils, each coil having a respective pair of coil terminals so that it can be independently driven by an audio signal, and wherein each of the plurality of coils is underhung and there are at least two adjacent coils, from the plurality of coils, that are completely within a magnetic gap, and at least two other coils that are completely outside the magnetic gap, during a majority of the movement of the coil assembly;

a magnetic system that defines the magnetic gap in which the coil assembly is positioned for movement, wherein the coil assembly as a whole is overhung;

a position sensor that is to produce coil position data indicative of displacement of the coil assembly within the magnetic gap;

an audio amplifier subsystem that is coupled to drive the plurality of coils with the audio signal; and a controller configured to control audio amplifier gain in the audio amplifier subsystem, based on the coil position data, wherein audio amplifier gain for driving a coil that is entering the magnetic gap is increased from a low level to a high level in proportion to how much of the coil is within the magnetic gap.

21. The audio system of claim 20 wherein the controller is configured to decrease the audio amplifier gain from the high level to the low level, as the coil is exiting the magnetic gap, in proportion to how much of the coil is outside of the magnetic gap.

* * * * *